United States Patent [19]

Delacruz

[11] 4,262,220

[45] Apr. 14, 1981

[54] OPTICAL CURRENT ISOLATOR CIRCUIT

[75] Inventor: Moises A. Delacruz, Cottage Grove, Minn.

[73] Assignee: Rosemount Inc., Minneapolis, Minn.

[21] Appl. No.: 24,786

[22] Filed: Mar. 28, 1979

[51] Int. Cl.³ .............................................. H03K 3/42
[52] U.S. Cl. .............................. 307/311; 307/DIG. 1; 307/315; 250/552
[58] Field of Search .................. 307/311, DIG. 1, 315; 250/552, 211 J

[56] References Cited

U.S. PATENT DOCUMENTS

| | | | |
|---|---|---|---|
| 3,881,118 | 4/1975 | Forrest et al. | 307/311 |
| 4,181,863 | 1/1980 | Parker | 307/311 |

OTHER PUBLICATIONS

IBM Tech. Disclosure Bttn., Self-Regulating Current Switch for Photodetectors by R. A. Brecke et al., vol. 19, No. 2, Jul. 1976, pp. 642–643.

*Primary Examiner*—Stanley D. Miller, Jr.
*Assistant Examiner*—B. P. Davis
*Attorney, Agent, or Firm*—Kinney, Lange, Braddock, Westman and Fairbairn

[57] ABSTRACT

A current isolation circuit converts a pulse width modulated input signal to an isolated DC output current whose magnitude is a function of the duty cycle of the input signal. The isolation circuit includes an optical isolator which receives the pulse width modulated input signal and has an output which changes between a conductive and a non-conductive state in response to the input signal. A voltage regulating diode, such as a Zener diode, is connected to the output of the optical isolator and to an isolated power supply so that the voltage across the Zener diode varies between two known voltage values in response to the switching of the optical isolator output between conductive and non-conductive states. A signal derived from the Zener diode is filtered to produce a reference signal with a magnitude which is a function of the duty cycle of the input signal. An output current path is connected between the power supply and an output current terminal, and includes a current control device which controls the output current as a function of a control signal. A comparison signal derived from the output current path is compared to the reference signal, and the control signal is produced as a function of the comparison. As a result, the output current is controlled as a function of the input signal duty cycle.

17 Claims, 1 Drawing Figure

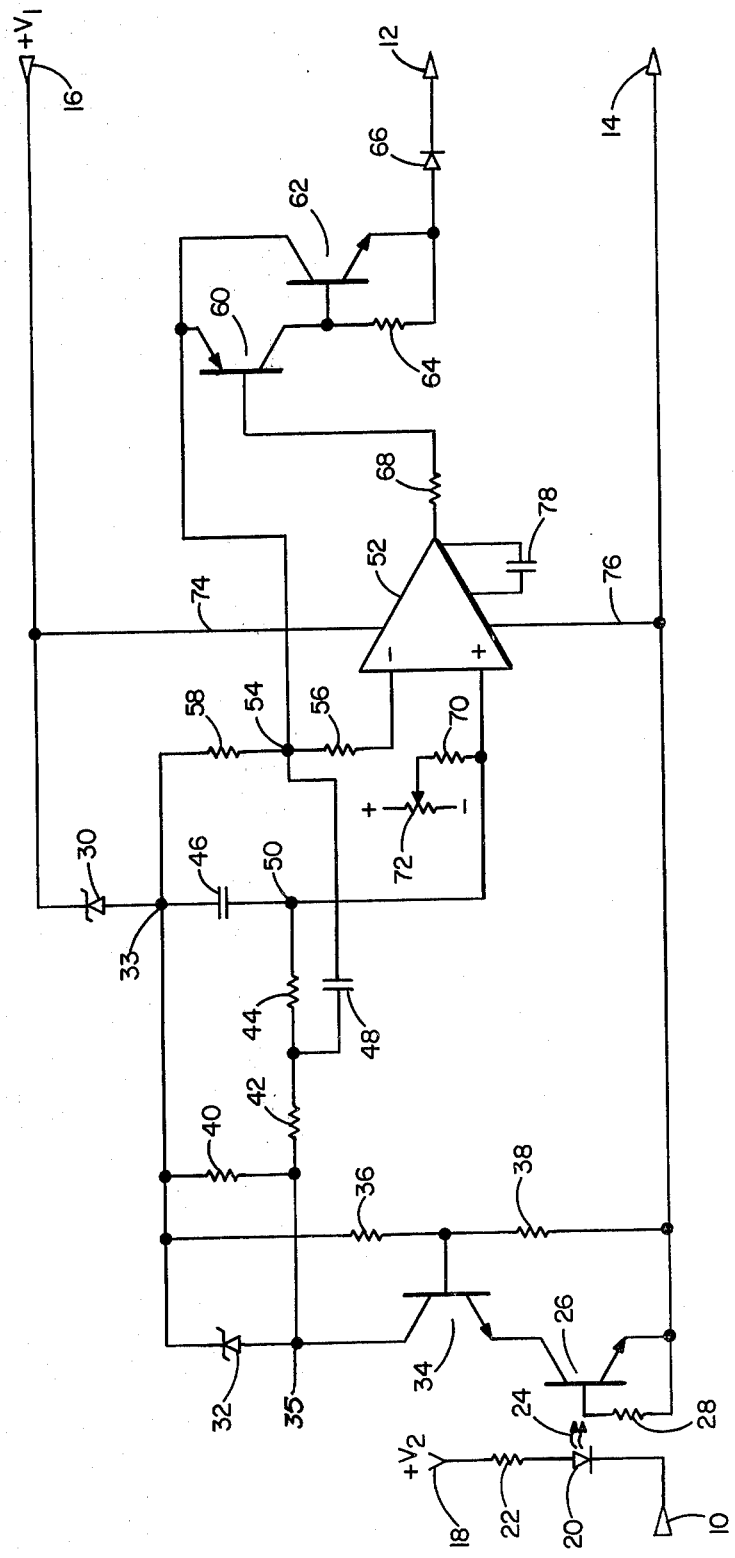

OPTICAL CURRENT ISOLATOR CIRCUIT

BACKGROUND OF THE INVENTION

The present invention relates to electrical isolation devices. In particular, the present invention is a device for providing an electrically isolated output current whose magnitude is a function of the duty cycle of a time varying input signal.

Electrical isolation of signals or circuits is required in a wide variety of applications. Electrical isolation may be required due to differences in operating voltages between the source of the input signal and the signal processing circuitry, for noise consideration, or for a wide variety of other considerations.

One widely used technique of isolating circuits or portions of circuits is by means of an optical isolator. A typical optical isolator includes a light source, such as light emitting diode, and a light sensor, such as a phototransistor. The light emitting diode and phototransistor are often packaged in the same integrated circuit package, but are electrically isolated from one another. The light emitting diode is driven by an input signal to produce light, and the phototransistor provides an output which is a function of the light received from the light emitting diode.

It is important that isolation circuitry not introduce errors. This can present a problem with optical couplers, since the gain characteristics of a phototransistor can vary from unit to unit. In addition, the characteristics of the phototransistor often vary as a function of temperature, thereby making the accuracy of the optical isolator circuitry temperature dependent.

SUMMARY OF THE INVENTION

The present invention is an isolation circuit which provides an electrically isolated output current whose magnitude is a function of the duty cycle of the time varying input signal. The current isolation circuit of the present invention preferably utilizes an optical coupler, but overcomes problems of variation in gain characteristics and temperature dependence of the light sensing means of the optical coupler.

In the present invention, light source means of an optical isolator is connected to receive a periodic input signal and to provide optical signals as a function of the input signal. Light sensing means receives the optical signals and changes between a non-conductive and a conductive state in response to the optical signals.

Voltage regulating means, which in one preferred embodiment is a Zener diode, is connected in circuit with the light sensing means. The voltage regulating means causes a signal to be produced which varies between two known values in response to switching of the light sensing means between conductive and non-conductive states, regardless of the gain characteristics and temperature dependence of the light sensing means. This signal is converted to a reference signal having a magnitude which is a function of the duty cycle of the input signal.

An output current path is provided from voltage source means to an output terminal. The output current path includes a current control device which controls the output current as a function of the control signal. A comparison signal derived from the output current path is compared to the reference signal, and the control signal is produced as a function of this comparison. As a result, the output current is controlled as a function of the reference signal, and thus as a function of the input signal duty cycle.

BRIEF DESCRIPTION OF THE DRAWINGS

The FIGURE is an electrical schematic diagram of a preferred embodiment of the current isolation circuit of the present invention.

DETAILED DESCRIPTION OF THE PREFERRED EMBODIMENTS

The current isolation circuit of the present invention, as shown in the Figure, has an input terminal 10 at which a pulse width modulated input signal is supplied. First and second output terminals 12 and 14 provide an isolated output current whose magnitude is a function of the duty cycle of the pulse width modulated input signal received at input terminal 10. In the embodiment shown in the Figure, the output current flows from first output terminal 12, through a load (not shown), and back to second input terminal 14.

Power supply terminal 16 receives a positive voltage $+V_1$ from an isolated voltage supply (not shown). A second voltage $+V_2$ is supplied at terminal 18 from a different source (not shown).

Light emitting diode 20 has its cathode connected to input terminal 10 and its anode connected through resistor 22 to terminal 18. The pulse width modulated input signal supplied at input terminal 10 varies between zero volts and a voltage which is approximately equal to $+V_2$. When the pulse width modulated input signal is at zero volts, light emitting diode 20 is turned on and emits light, as illustrated by arrows 24. When the pulse width modulated input signal is high, light emitting diode 20 is turned off, and no light is emitted. The duration of the light 24 depends, therefore, on the time duration during each cycle that the input signal is low.

Phototransistor 26 receives light 24 from light emitting diode 20. In one preferred embodiment, light emitting diode 20 and phototransistor 26 are packaged in a single package as an optical isolator. As shown in the Figure, phototransistor 28 is an NPN phototransistor, with its emitter connected to output terminal 14, and its base connected to output terminal 14 through resistor 28.

The collector and emitter of phototransistor 26 are in a current path between input voltage terminal 16 and second output terminal 14. This current path includes Zener diode 30, Zener diode 32 and resistor 40, and the collector-emitter current path of NPN buffer transistor 34, in addition to the collector-emitter current path of phototransistor 26. As shown in the Figure, the cathode of first Zener diode 30 is connected to input voltage terminal 16, and the anode of first Zener diode 30 is connected to the cathode of second Zener diode 32 at circuit node 33. The anode of second Zener diode 32 is connected to the collector of buffer transistor 34 at circuit node 35, and the emitter of transistor 34 is connected to the collector of phototransistor 26. The base of buffer transistor 34 is connected to the junction of a voltage divider formed by resistors 36 and 38, which are connected between circuit node 33 and output terminal 14.

As shown in the Figure, buffer transistor 34 is provided to reduce the effect of the Miller capacitance of phototransistor 26. Current flowing through buffer transistor 34 as a result of phototransistor 26 being turned on drives second Zener diode 32. Resistor 40 is connected across second Zener diode 32 and acts as a bleeder to turn off second Zener diode 32.

Connected to second Zener diode 32 is a two pole (Butterworth) filter formed by resistors 42 and 44 and capacitors 46 and 48. Resistors 42 and 44 are connected in series between circuit node 35 and reference circuit node 50, which is connected to the non-inverting input of operational amplifier 52. Capacitor 46 is connected between the cathode of Zener diode 32 and reference circuit node 50. Capacitor 48 is connected between the junction of resistors 42 and 44 and comparison circuit node 54. The Butterworth filter produces a DC reference voltage at reference circuit node 50 (and thus at the non-inverting input of operational amplifier 52) which has a magnitude which is a function of the duty cycle of the input signal. In other words, the longer during each cycle that the input signal is low (and therefore phototransistor 26 is turned on), the lower the voltage at reference circuit node 50.

The inverting input to operational amplifier 52 is connected to comparison circuit node 54 through resistor 56. As described later, the voltage at comparison circuit node 54 is a DC comparison voltage whose magnitude is a function of the output current.

The output current of the circuit is supplied from voltage supply terminal 16 to first output terminal 12 through a current path including cathode-to-anode of first Zener diode 30, resistor 58, comparison circuit node 54, a current control circuit formed by transistors 60 and 62 and resistor 64, and anode-to-cathode of diode 66. The output current is controlled by the output of operational amplifier 52, which is connected through resistors 68 to the base terminal of transistor 60. The emitter of PNP transistor 60 is connected to circuit node 54, as is the collector of transistor 62. The collector of transistor 60 is connected to the base of transistor 62, and the emitter of transistor 62 is connected to the anode of diode 66.

Also shown in the Figure is an optional offset compensation circuit connected to the non-inverting input of operational amplifier 52. This offset compensating circuit includes resistor 70 and potentiometer 72. Alternatively, offset compensation may be provided in signal processing circuitry (not shown) which is connected to output terminals 12 and 14 and which receives and processes the output signal.

Power is supplied to operational amplifier 52 through conductors 74 and 76, which are connected to input power terminal 16 and second output terminal 14, respectively. Capacitor 78 is also connected to operational amplifier 52, as illustrated in the Figure.

The operation of the current isolation circuit shown in the Figure is generally as follows. First Zener diode 30 establishes a DC supply voltage at circuit node 33 with respect to common second output terminal 14 which is equal to voltage $V_1$ less the Zener breakdown voltage of first Zener diode 30. For example, in one preferred embodiment voltage $V_1$ was twenty-eight volts and the Zener breakdown voltage of first Zener diode 30 was three volts. The voltage at circuit node 33 therefore, was twenty-five volts. This twenty-five volt potential is common to both the reference circuitry which produces the reference voltage at circuit node 50 and the output current circuitry which produces the comparison voltage at circuit node 54.

The pulse width modulated input signal which is supplied at input terminal 10 drives light emitting diode 20 on and off. When light emitting diode 20 is on, optical signals 24 are supplied to phototransistor 26, causing phototransistor 26 to turn on (i.e. its conductive output state). When light emitting diode 20 turns off, phototransistor 26 is turned off (i.e. its non-conductive output state). The percentage of off-to-on time of phototransistor 26 is a function of the duty cycle of the pulse width modulated input signal.

Second Zener diode 32 is connected in series with buffer transistor 34 and phototransistor 26 between circuit node 33 and second output terminal 14. When phototransistor 26 is turned on, the voltage at circuit node 35 is limited by Zener diode 32 to the supply voltage at circuit node 33 less the Zener breakdown voltage of second Zener diode 32. In the successful embodiment in which supply voltage at circuit node 33 was twenty-five volts, the breakdown voltage of Zener diode 32 was two and one-half volts. In that embodiment, therefore, the voltage at circuit node 35 had a minimum value of twenty-two and one-half volts when phototransistor 26 was turned on.

When phototransistor 26 turns off, the voltage at circuit node 35 rises to essentially the supply voltage at circuit node 33. Second Zener diode 32, therefore, limits the range of variation of the voltage of circuit node 35 to between two known voltage values. As a result, the effects of variation in the gain characteristics of phototransistor 26 and variations due to temperature dependence of the characteristics of phototransistor 26 are eliminated. The voltages at circuit node 35 are determined by the characteristics of Zener diode 32, not by the characteristics of phototransistor 26.

The Butterworth filter formed by resistors 42 and 44 and capacitors 46 and 48 converts the signal at circuit node 35 to a DC reference voltage at circuit node 50. The use of Zener diode 32 has the further advantage of defining the range of variation of the reference voltage. For example, in the previously described embodiment in which the supply voltage at circuit node 33 is twenty-five volts and Zener diode 32 has a two and one-half volt breakdown voltage, the range of variation of the reference voltage at circuit node 50 is limited by second Zener diode 32 to between twenty-two and one-half volts and twenty-five volts. When the input signal is in its low state for a large percentage of each cycle, phototransistor 26 will be turned on for a large percentage of each cycle and the reference voltage will be near twenty-two and one-half volts. Conversely, when the input signal is in its low state for a small percentage of each cycle, the reference voltage will be near twenty-five volts.

The output current of the circuit flows from circuit node 33 through resistor 58 to circuit node 54 and then through the current control formed by transistors 60 and 62 and resistors 64 and diode 66 to first output terminal 12. It can be seen, therefore, that the comparison voltage at circuit node 54 is dependent upon the output current. As the output current increases, the voltage drop across resistor 58 increases, and therefore the voltage at circuit node 54 decreases. Alternatively, as output current decreases, the voltage at circuit node 54 increases.

The magnitude of the output current is controlled by operational amplifier 52, which compares the reference voltage and the comparison voltage and supplies a control signal to the base of transistor 60. An increase in the output of operational amplifier 52 increases the voltage at the base of transistor 60, which reduces the base-emitter voltage. This causes less current to flow through the output current path. Similarly, a reduction in the output of operational amplifier 52 decreases the voltage at the base of transistor 62 and increases the base-emitter voltage. This causes transistor 60 and 62 to turn on harder and increases the output current.

In order to illustrate the operation of the current isolator circuit of the present invention, consider first an example in which the circuit is initially balanced, and the percentage of "low" state of the input signal in each cycle decreases. This causes phototransistor 26 to be turned on a lower percentage of each cycle which results in an increase in the reference voltage at circuit node 50. The increase in reference voltage causes the output of operational amplifier 52 to increase, which results in a decrease in the output current. This reduces the voltage drop across resistor 58 and thereby increases the comparison voltage at circuit node 54 until balance is again reestablished.

Conversely, if the percentage of "low" state of the input signal per cycle increases, phototransistor 26 will be turned on a greater percentage of each cycle. This causes a decrease in the reference voltage at circuit node 50. This in turn causes a decrease in the output of operational amplifier 52, thereby turning on transistors 62 and 64 harder and increasing the output current. The increase in output current increases the voltage drop across resistor 58 and decreases the comparison voltage at circuit node 54 until balance is again reestablished.

Table 1 is a list of components used in one successful embodiment of the isolation circuit shown in the Figure. In this embodiment, optional offset compensation resistor 70 and potentiometer 72 were not used.

TABLE 1

| Resistor | 22 | 330 Ohm |
| --- | --- | --- |
| | 28 | 330K Ohm |
| | 36 | 18K Ohm |
| | 38 | 6.8K Ohm |
| | 40 | 2.5K Ohm |
| | 42 | 330K Ohm |
| | 44 | 200K Ohm |
| | 58 | 120 Ohm |
| | 60 | 510K Ohm |
| | 64 | 10K Ohm |
| | 68 | 4.7K Ohm |
| Capacitor | 46 | 0.22 uf |
| | 48 | 0.47 uf |
| | 78 | 150 pf |
| Transistor | 34 | 2N2222 |
| | 60 | 2N4060 |
| | 62 | 2N2219 |
| Zener Diode | 30 | 1N751A |
| | 32 | LM336 |
| Diode | 66 | 1N4148 |
| Operational Amplifier | 52 | LM308 |
| Light Emitting Diode | 20/Phototransistor 26 | 4N28A |

In conclusion, the current isolation circuit of the present invention provides an output current which is a function of the duty cycle of a pulse width modulated input signal. The current isolation circuit, by use of Zener diode 32 connected in circuit with the phototransistor of an optical isolator eliminates the problems of temperature dependence of the phototransistor. In addition, Zener diode 32 reduces calibration problems from circuit to circuit by providing a signal which is independent of the gain of the phototransistor. In addition, Zener diode 32 establishes a known range of reference voltage variation, thereby permitting more stable and reliable operation.

Although the present invention has been described with reference to preferred embodiments, workers skilled in the art will recognize that changes may be made in form and detail without departing from the spirit and scope of the invention.

What is claimed is:

1. An isolation circuit for receiving a periodic input signal and providing an isolated output signal having a magnitude which is a function of the periodic input signal, the isolation circuit comprising:

optical isolator means having an input for receiving the periodic input signal and having an output which switches between conductive and non-conductive output states as a function of the periodic input signal;

voltage regulating means connected in circuit with the output of the optical isolator means for providing a signal having a first predetermined value when the output of the optical isolator means is in its conductive state and having a second predetermined value when the output of the optical isolator means is in its non-conductive state;

means for converting the signal provided by the voltage regulating means to a reference signal having a magnitude which is a function of the periodic input signal;

means for providing a comparison signal having a magnitude which is a function of the isolated output signal; and output control means for controlling the isolated output signal as a function of the reference signal and the comparison signal, 2. The isolation circuit of claim 1 wherein the voltage regulating means is connected in series with the output of the optical isolator means.

3. The isolation circuit of claim 2 wherein the voltage regulating means comprises Zener diode means.

4. The isolation circuit of claim 3 wherein the signal provided by the voltage regulating means is a voltage signal.

5. The isolation circuit of claim 4 wherein the reference signal is a reference voltage and wherein the comparison signal is a comparison voltage.

6. The isolation circuit of claim 5 wherein the isolated output signal is an output current and wherein the comparison voltage is derived from a current path through which the output current flows.

7. The isolation circuit of claim 3 wherein the optical isolator means comprises:

light source means for supplying optical signals as a function of the periodic input signal; and phototransistor means having collector and emitter electrodes and having the conductive state when optical signals are supplied and the non-conductive state when optical signals are not supplied.

8. The isolation circuit of claim 7 wherein the Zener diode means is connected in series with the collector and emitter electrodes of the phototransistor means.

9. The isolation circuit of claim 8 and further comprising:

buffer transistor means connected in series with the Zener diode means and the phototransistor means.

10. The isolation circuit of claim 1 wherein the isolated output signal is an output current and wherein the output control means comprises:

comparing means for comparing the reference signal and the comparison signal and supplying a control signal as a function of the comparison; and current control means for controlling the output current as a function of the control signal.

11. A current isolation circuit for receiving a periodic input signal and providing an isolated output current having a magnitude related to the duty cycle of the periodic input signal; the current isolation circuit comprising:

input means for receiving the periodic input signal;

first and second output terminal means for supplying the output current;

isolated voltage source means for providing a supply voltage between a first circuit node and the second output terminal;

light source means connected to the input means for supplying optical signals as a function of the periodic input signal;

light sensing means for receiving the optical signals, the light sensing means having conductive and non-conductive states controlled by the optical signals;

a first current path beetweenn the first circuit node and the second output terminal including voltage regulating means and the light sensing means, and having a second circuit node at which a voltage has a first predetermined value when the light sensing means is in its conductive state and has a second predetermined value when the light sensing means is in its second conductive state;

means connected to the second circuit node for providing, at a reference circuit node, a reference signal having a magnitude which is a function of the duty cycle of the periodic input signal;

a second current path between the first circuit node and the first output terminal through which the output current flows, the second current path including current control means for controlling the output current through the second current path as a function of a control signal and including a comparison circuit node, wherein a comparison signal at the comparison circuit node is a function of the output current flowing through the second current path; and comparing means for comparing the reference signal and the comparison signal and supplying the control signal as a function of the comparison.

12. The current isolation circuit of claim 11 wherein the voltage regulating means comprises Zener diode means.

13. The current isolation circuit of claim 12 wherein the light sensing means comprises phototransistor means having its collector-emitter current path connected in the first current path.

14. The current isolation circuit of claim 13 and further comprising:

buffer transistor means connected in the first current path with its collector-emitter current path in series with the Zener diode means and the collector-emitter current path of the phototransistor means.

15. The current isolation circuit of claim 11 wherein the reference signal is a reference voltage and the comparison signal is a comparison voltage.

16. The current isolation circuit of claim 15 wherein the means connected to the second circuit node comprises filter means for filtering the voltage at the second circuit node to provide the reference voltage at the reference circuit node.

17. An isolation circuit for receiving a periodic input signal having a variable duty cycle and providing an isolated DC output signal having a magnitude which is a function of the duty cycle of the periodic input signal, the isolation circuit comprising:

optical isolator means having an input for receiving the periodic input signal and having an output which switches between conductive and non-conductive output states as a function of the periodic input signal;

voltage regulating means connected in circuit with the output of the optical isolator means for providing a signal having a first predetermined value when the output of the optical isolator means is in its conductive state and having a second predetermined value when the output of the optical isolator means is in its non-conductive state;

means for converting the signal provided by the voltage regulating means to a reference signal having a magnitude which is a function of the duty cycle of the periodic input signal;

means for providing a comparison signal having a magnitude which is a function of the isolated DC output signal; and output control means for controlling the isolated DC output signal as a function of the reference signal and the comparison signal.

* * * * *